US012764930B2

(12) United States Patent
Jung et al.

(10) Patent No.: US 12,764,930 B2
(45) Date of Patent: Oct. 13, 2026

(54) INTEGRATED CIRCUIT DEVICE AND METHOD OF MANUFACTURING THE SAME

(71) Applicant: Samsung Electronics Co., Ltd., Suwon-si (KR)

(72) Inventors: Kyooho Jung, Suwon-si (KR); Jongyeong Min, Suwon-si (KR); Jiye Baek, Suwon-si (KR); Yeseul Lee, Suwon-si (KR); Jinwook Lee, Suwon-si (KR); Changhwa Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 534 days.

(21) Appl. No.: 18/333,084

(22) Filed: Jun. 12, 2023

(65) Prior Publication Data

US 2024/0015948 A1 Jan. 11, 2024

(30) Foreign Application Priority Data

Jul. 5, 2022 (KR) ........................ 10-2022-0082758

(51) Int. Cl.
*H10B 12/00* (2023.01)

(52) U.S. Cl.
CPC ....... *H10B 12/315* (2023.02); *H10B 12/0335* (2023.02); *H10B 12/34* (2023.02)

(58) Field of Classification Search
CPC .. H10B 12/315; H10B 12/0335; H10B 12/34; H10B 12/03; H10B 12/30; H10B 12/482; H10B 12/033; H10D 1/716; H10D 1/684; H10D 1/692; H01L 21/0228
See application file for complete search history.

(56) References Cited

U.S. PATENT DOCUMENTS

| | | | | |
|---|---|---|---|---|
| 8,288,241 | B2 | 10/2012 | Hirota et al. | |
| 8,853,049 | B2 | 10/2014 | Deweerd et al. | |
| 8,896,097 | B2 | 11/2014 | Wamura et al. | |
| 11,133,314 | B2 | 9/2021 | Jung et al. | |
| 11,227,912 | B2 | 1/2022 | Jung et al. | |
| 2016/0087028 | A1 | 3/2016 | Hirota et al. | |
| 2017/0352666 | A1* | 12/2017 | Ahn | H10B 12/485 |
| 2020/0020780 | A1 | 1/2020 | Kim | |
| 2020/0335333 | A1 | 10/2020 | Kang et al. | |
| 2021/0005609 | A1 | 1/2021 | Kim et al. | |
| 2021/0359082 | A1* | 11/2021 | Kang | H10B 53/30 |

OTHER PUBLICATIONS

Korean Office Action dated Apr. 27, 2026 for corresponding Korean Patent Application No. 10-2022-0082758 and its English-language translation.

* cited by examiner

*Primary Examiner* — Cuong B Nguyen
(74) *Attorney, Agent, or Firm* — Harness, Dickey & Pierce, P.L.C.

(57) ABSTRACT

A method of manufacturing an integrated circuit device may include forming a plurality of lower electrodes above a substrate, forming a supporter configured to support the plurality of lower electrodes, forming a dielectric film on the plurality of lower electrodes and the supporter, and forming an upper electrode on the dielectric film. The dielectric film may include a lower leakage current prevention layer on an outer surface of each of the plurality of lower electrodes and an outer surface of the supporter, a first capacitor material layer on the lower leakage current prevention layer, an upper material layer on the first capacitor material layer, and a second capacitor material layer on the upper material layer.

16 Claims, 20 Drawing Sheets

INTEGRATED CIRCUIT DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2022-0082758, filed on Jul. 5, 2022 in the Korean Intellectual Property Office, the disclosure of which is incorporated by reference herein in its entirety.

BACKGROUND

Inventive concepts relate to an integrated circuit device and/or a method of manufacturing the same, and more particularly, to an integrated circuit device including a capacitor and/or a method of manufacturing the integrated circuit device.

With the recent rapid development of miniaturized semiconductor process technology, the high integration density of integrated circuit devices has been accelerated, and the area of each cell has decreased. Accordingly, an area that may be occupied by a capacitor in each cell has also decreased. For example, with the increase in the integration density of integrated circuit devices, such as dynamic random access memory (DRAM), the area of each cell has decreased while necessary capacitance has been maintained or increased. What is therefore needed is a structure for maintaining desired electrical characteristics by overcoming the spatial limit of a capacitor and the limit of design rules and increasing the capacitance of the capacitor.

SUMMARY

Inventive concepts provide a method of manufacturing an integrated circuit device, by which leakage current flowing through a capacitor dielectric film between neighboring lower electrodes may be decreased by forming a lower leakage current prevention layer on the capacitor dielectric film by using atomic layer deposition (ALD) in which a very small amount of impurities may be supplied as a precursor.

Inventive concepts are not limited to what is mentioned above and will be clearly understood by those skilled in the art from the descriptions below.

According to an embodiment of inventive concepts, a method of manufacturing an integrated circuit device may include forming a plurality of lower electrodes above a substrate, forming a supporter configured to support the plurality of lower electrodes, forming a dielectric film on the plurality of lower electrodes and the supporter, and forming an upper electrode on the dielectric film. The dielectric film may include a lower leakage current prevention layer on an outer surface of each of the plurality of lower electrodes and an outer surface of the supporter, a first capacitor material layer on the lower leakage current prevention layer, an upper material layer on the first capacitor material layer, and a second capacitor material layer on the upper material layer.

According to an embodiment of inventive concepts, a method of manufacturing an integrated circuit device may include forming a plurality of lower electrodes above a substrate, forming a supporter configured to support the plurality of lower electrodes, forming a dielectric film on the plurality of lower electrodes and the supporter, and forming an upper electrode on the dielectric film. The dielectric film may include a lower leakage current prevention layer on an outer surface of each of the plurality of lower electrodes and an outer surface of the supporter, a first capacitor material layer on the lower leakage current prevention layer, an upper material layer on the first capacitor material layer, a second capacitor material layer on the upper material layer, and an upper leakage current prevention layer on the second capacitor material layer.

According to an embodiment of inventive concepts, a method of manufacturing an integrated circuit device may include forming an isolation film on a substrate, the isolation film defining an active region of the substrate; forming a gate structure on the substrate, the gate structure crossing the active region and extending in a first direction; forming a source/drain in the active region, the source/drain respectively at opposite sides of the gate structure; forming a bit line structure on the substrate, the bit line structure extending in a second direction, the second direction being perpendicular to the first direction; forming a plurality of contact structures on the source/drain, respectively; forming a plurality of lower electrodes on the plurality of contact structures, respectively; forming a supporter configured to support the plurality of lower electrodes; forming a dielectric film on the plurality of lower electrodes and the supporter; and forming an upper electrode on the dielectric film. The dielectric film may include a lower leakage current prevention layer on an outer surface of each of the plurality of lower electrodes and an outer surface of the supporter, a first capacitor material layer on the lower leakage current prevention layer, an upper material layer on the first capacitor material layer, and a second capacitor material layer on the upper material layer.

BRIEF DESCRIPTION OF THE DRAWINGS

Embodiments will be more clearly understood from the following detailed description taken in conjunction with the accompanying drawings in which.

DETAILED DESCRIPTION

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinafter, embodiments are described in detail with reference to the accompanying drawings.

Figure 1:
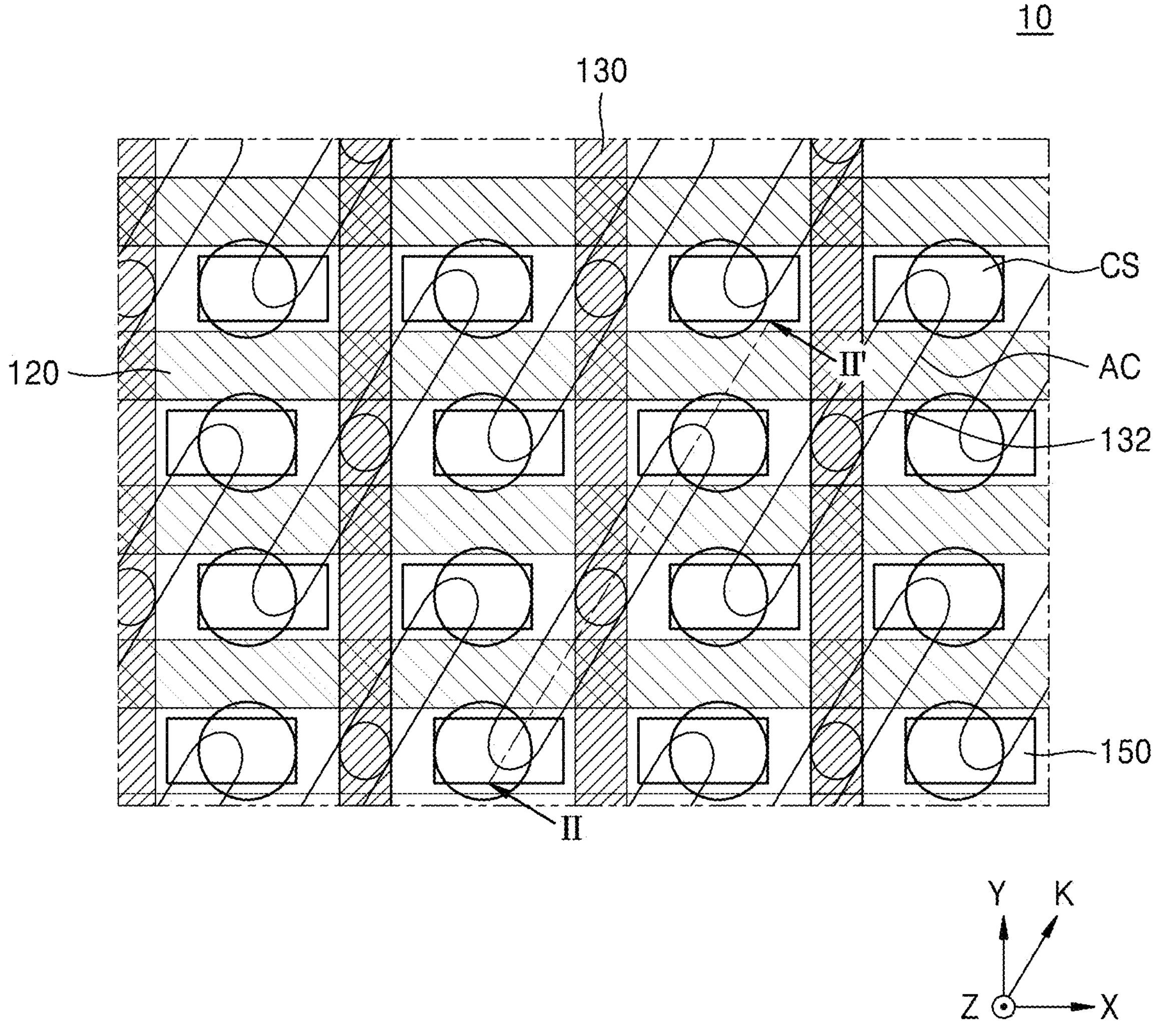
FIG. 1 is a layout diagram of an integrated circuit device according to an embodiment.
Figure 2:
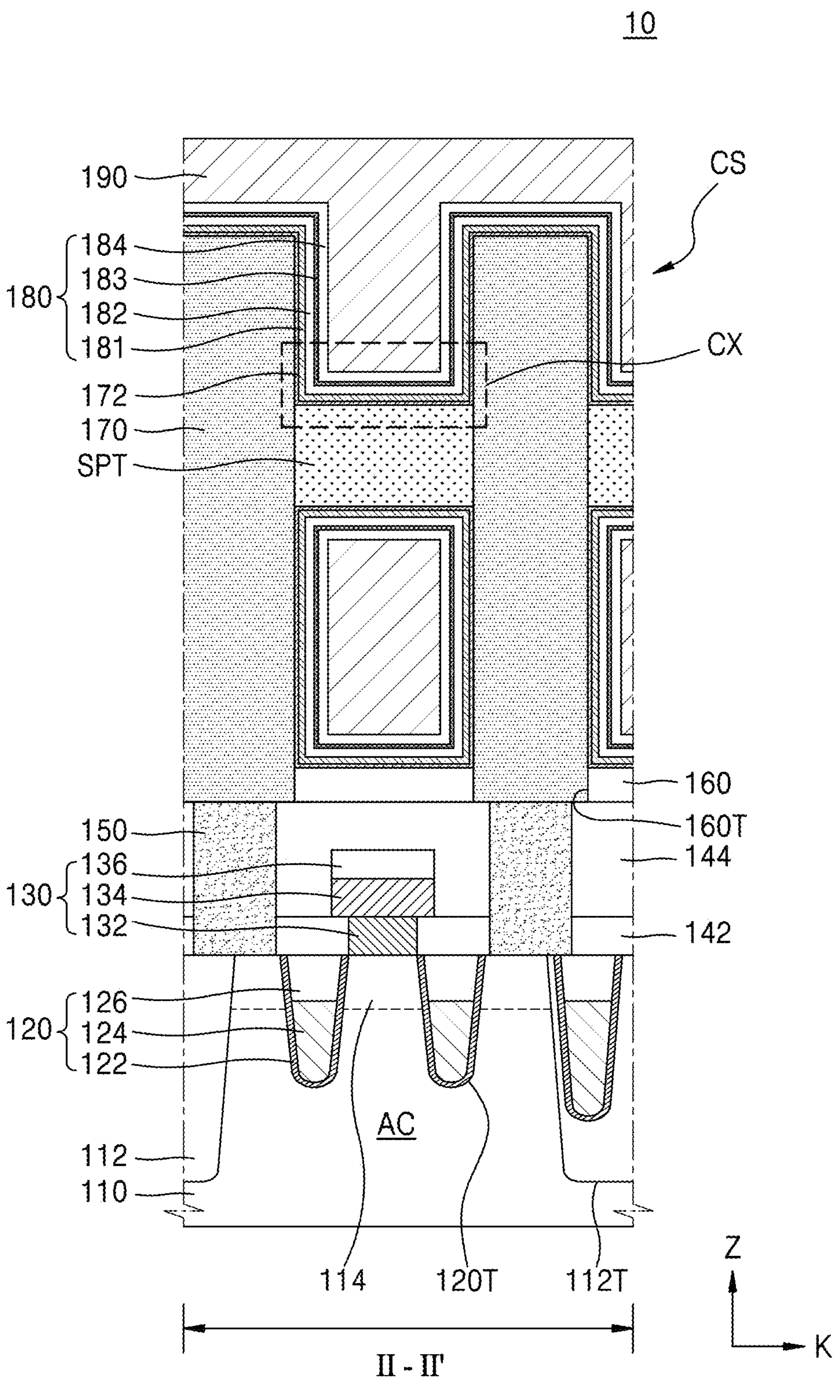
FIG. 2 is a cross-sectional view of an integrated circuit device according to an embodiment.
Figure 3:
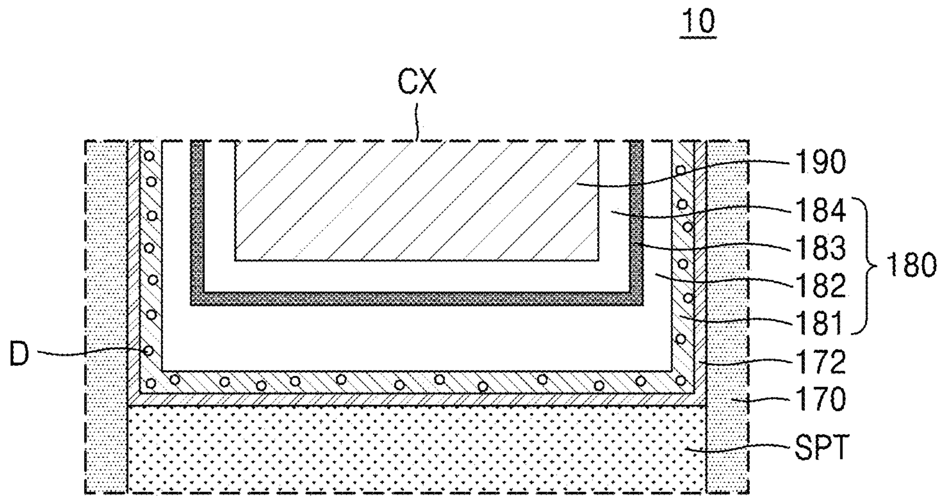
FIG. 3 is an enlarged cross-sectional view of a region CX in FIG. 2.

FIG. 1 is a layout diagram of an integrated circuit device 10 according to an embodiment, FIG. 2 is a cross-sectional view taken along a line II-II' in FIG. 1, and FIG. 3 is an enlarged view of a region CX in FIG. 2.

Referring to FIGS. 1 to 3, the integrated circuit device 10 may include a lower electrode 170 above a substrate 110, a supporter SPT supporting the lower electrode 170, a dielectric film 180 on the lower electrode 170, and an upper electrode 190 on the dielectric film 180.

The substrate 110 may include an active region AC defined by an isolation film 112. The substrate 110 may correspond to a wafer including silicon (Si). In some embodiments, the substrate 110 may correspond to a wafer including a semiconductor element, such as germanium (Ge), or a compound semiconductor, such as silicon carbide (SiC), gallium arsenide (GaAs), indium arsenide (InAs), or indium phosphide (InP). The substrate 110 may have a silicon on insulator (SOI) structure. The substrate 110 may include a conductive region, e.g., an impurity-doped well or an impurity-doped structure.

For example, the isolation film 112 may have a shallow trench isolation (STI) structure. The isolation film 112 may include an insulating material filling an isolation trench 112T in the substrate 110. The insulating material may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ) but is not limited thereto.

The active region AC may have a relatively long island shape. The long axis of the active region AC may be arranged in a K-direction that is parallel with a top surface of the substrate 110. The active region AC may be doped with p-type or n-type impurities.

The substrate 110 may include a gate line trench 120T extending in an X-direction. The gate line trench 120T may cross the active region AC and have a certain depth from the top surface of the substrate 110. A portion of the gate line trench 120T may extend to the inside of the isolation film 112. The bottom of a gate line trench 120T in the isolation film 112 may be at a lower level than the bottom of a gate line trench 120T in the active region AC.

A source/drain region 114 may be on the active region AC at each of opposite sides of a gate line trench 120T. The source/drain region 114 may include an impurity region, which is doped with impurities of a different conductivity type than the active region AC. The source/drain region 114 may be doped with n-type or p-type impurities.

A gate structure 120 may be formed in the gate line trench 120T. The gate structure 120 may include a gate insulating layer 122, a gate electrode layer 124, and a gate capping layer 126, which are sequentially formed on the inner wall of the gate line trench 120T.

The gate insulating layer 122 may be conformally formed on the inner wall of the gate line trench 120T to a certain thickness. The gate insulating layer 122 may include at least one selected from silicon oxide, silicon nitride, silicon oxynitride, oxide/nitride/oxide (ONO), and a high-k material having a higher dielectric constant than silicon oxide.

The gate electrode layer 124 may be formed on the gate insulating layer 122 to fill the gate line trench 120T up to a certain height from the bottom of the gate line trench 120T. The gate electrode layer 124 may include a work function control layer (not shown) on the gate insulating layer 122 and a buried metal layer (not shown) on the work function control layer, wherein the buried metal layer fills a bottom portion of the gate line trench 120T.

The gate capping layer 126 may be on the gate electrode layer 124 and may fill the remaining portion of the gate line trench 120T. For example, the gate capping layer 126 may include at least one selected from silicon oxide, silicon oxynitride, and silicon nitride.

A bit line structure 130 may be on the source/drain region 114 and may extend in a Y-direction that is perpendicular to the X-direction. The bit line structure 130 may include a bit line contact 132, a bit line 134, and a bit line capping layer 136, which are sequentially stacked on the substrate 110. For example, the bit line contact 132 may include polysilicon, the bit line 134 may include a metal material, and the bit line capping layer 136 may include silicon nitride or silicon oxynitride.

A first interlayer insulating film 142 may be on the substrate 110. The bit line contact 132 may pass through the first interlayer insulating film 142 to be connected to the source/drain region 114. The bit line 134 and the bit line capping layer 136 may be on the first interlayer insulating film 142. A second interlayer insulating film 144 may be on the first interlayer insulating film 142 and may cover the side surfaces of the bit line 134 and the side and top surfaces of the bit line capping layer 136.

A contact structure 150 may be on the source/drain region 114. The first and second interlayer insulating films 142 and 144 may surround the side wall of the contact structure 150. In some embodiments, the contact structure 150 may include a lower contact (not shown), a metal silicide layer (not shown), and an upper contact (not shown), which are sequentially stacked on the substrate 110.

A capacitor structure CS may be on the second interlayer insulating film 144. The capacitor structure CS may include the lower electrode 170 electrically connected to the contact structure 150, the dielectric film 180 conformally covering the lower electrode 170, and the upper electrode 190 on the dielectric film 180. An etch stop film 160 having an opening 160T may be on the second interlayer insulating film 144, and a bottom portion of the lower electrode 170 may be in the opening 160T of the etch stop film 160.

While FIGS. 1-3 show a plurality of capacitor structures CS respectively arranged on a plurality of contact structures 150, which are repeatedly arranged in the X- and Y-directions, example embodiments are not limited thereto. In some embodiments, a plurality of capacitor structures CS may be arranged in a honeycomb pattern on a plurality of contact structures 150, which may be repeatedly arranged in the X- and Y-directions.

The lower electrode 170 may include metal nitride, metal, or a combination thereof. For example, the lower electrode 170 may include at least one selected from TiN, TaN, WN, Ru, Pt, and Ir. The lower electrode 170 may be formed by chemical vapor deposition (CVD) or atomic layer deposition (ALD).

The lower electrode 170 may have a very large aspect ratio. For example, the aspect ratio of the lower electrode 170 may be about 10 to about 30. In detail, the diameter of the lower electrode 170 may be about 20 nm to about 100 nm, and the height of the lower electrode 170 may be about 500 nm to about 4000 nm, but the lower electrode 170 is not limited to these dimensions. As the lower electrode 170 has a large aspect ratio, the lower electrode 170 may collapse or break.

The supporter SPT may limit and/or prevent the lower electrode 170 from collapsing or breaking. The supporter SPT may have a plate shape including a supporter pattern in contact with the lower electrode 170. As an insulating film, the supporter SPT may include, for example, silicon oxide, silicon nitride, or silicon oxynitride.

In some embodiments, a lower doped layer 172 may be conformally formed on an outer surface of each of the lower electrode 170 and the supporter SPT. For example, the lower doped layer 172 may include titanium oxide ($TiO_2$) doped with a group V element as an impurity. The lower doped layer 172 may be formed by ALD and have a thickness that is less than or equal to about 1 nm, but embodiments are not limited thereto.

The dielectric film 180 may be on the outer surface of the lower doped layer 172 so as to surround the lower electrode 170 and the supporter SPT. The dielectric film 180 may have a stack structure sequentially including a lower leakage current prevention layer 181, a first capacitor material layer 182, an upper material layer 183, and a second capacitor material layer 184.

The lower leakage current prevention layer 181 may include a dielectric material doped with impurities D. For example, the impurities D may include at least one selected from aluminum (Al), Si, magnesium (Mg), calcium (Ca), cobalt (Co), yttrium (Y), tantalum (Ta), niobium (Nb), hafnium (Hf), zirconium (Zr), and molybdenum (Mo). The thickness of the lower leakage current prevention layer 181 may be less than or equal to about 1 nm but is not limited thereto.

In an embodiment, the lower leakage current prevention layer 181 may be formed by alternately performing first and second ALD processes, which include different precursors from each other, such that the lower leakage current prevention layer 181 includes a very small amount of impurities D. This is described in detail below.

The first capacitor material layer 182 may include a high-k material having a higher dielectric constant than silicon oxide. For example, the first capacitor material layer 182 may have a dielectric constant of about 10 to about 25. In detail, the first capacitor material layer 182 may include zirconium oxide ($ZrO_2$).

The upper material layer 183 may include aluminum oxide ($Al_2O_3$). The upper material layer 183 may reduce leakage current, which flows through the dielectric film 180 between a plurality of lower electrodes 170 and the upper electrode 190.

The second capacitor material layer 184 may include a high-k material having a higher dielectric constant than silicon oxide. For example, the second capacitor material layer 184 may have a dielectric constant of about 10 to about 25. In detail, the second capacitor material layer 184 may include $ZrO_2$.

In some embodiments, the first and second capacitor material layers 182 and 184 may include substantially the same material as each other, and the upper material layer 183 may include a different material than the first and second capacitor material layers 182 and 184.

The upper electrode 190 may be on the dielectric film 180. The upper electrode 190 may be conformally formed on the dielectric film 180 and may cover the lower electrode 170 with the dielectric film 180 between the upper electrode 190 and the lower electrode 170. In some embodiments, the upper electrode 190 may be in direct contact with the second capacitor material layer 184. The upper electrode 190 may include metal nitride, metal, or a combination thereof. For example, the upper electrode 190 may include at least one selected from TiN, TaN, WN, Ru, Pt, and Ir.

With the recent rapid development of miniaturized semiconductor process technology, the high integration density of the integrated circuit device 10 has been accelerated, and the area of each cell has decreased. Accordingly, an area that may be occupied by a capacitor structure CS in each cell has also decreased. For example, with the increase in the integration density of the integrated circuit device 10, such as dynamic random access memory (DRAM), the area of each cell has decreased while necessary capacitance has been maintained or increased.

Therefore, in a structure in which neighboring lower electrodes 170 are very close to each other because of the decrease in the area of each cell, leakage current may undesirably flow through the dielectric film 180. To limit and/or prevent leakage current from flowing through the dielectric film 180, an interface layer for limiting and/or preventing leakage current may be formed in the dielectric film 180, but the interface layer may hinder the crystallization of a high-k material of the dielectric film 180 and thus cause the capacitance of the dielectric film 180 to decrease. The high-k material of the dielectric film 180 is crystallized by the influence of a material of the lower electrode 170, but the interface layer hinders this influence.

In other words, what is needed is a structure for maintaining desired electrical characteristics by overcoming the spatial limit of the integrated circuit device 10 having a high integration density and the limit of design rules and increasing the capacitance of the integrated circuit device 10.

According to inventive concepts, to reduce leakage current flowing through the dielectric film 180 and limit and/or prevent the crystallization of a dielectric material of the dielectric film 180 from being reduced in the integrated circuit device 10, a material doped with a very small amount of impurities D may be formed as the lower leakage current prevention layer 181.

Eventually, leakage current flowing through the dielectric film 180 between neighboring lower electrodes 170 may be reduced in the integrated circuit device 10 by forming the lower leakage current prevention layer 181 using ALD in which a very small amount of impurities D may be supplied as a precursor.

Figure 4:
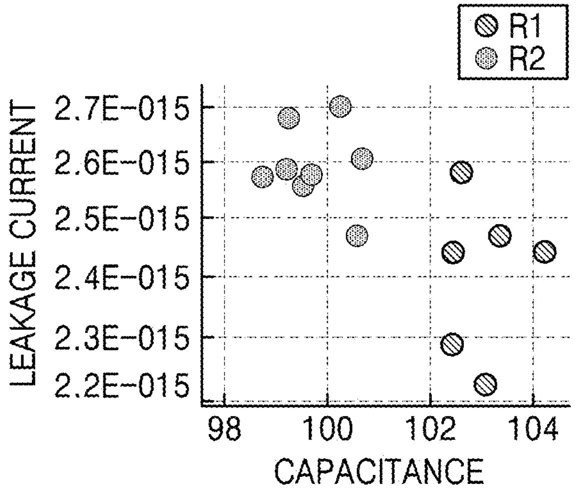
FIG. 4 is a graph showing the change in leakage current characteristics of an integrated circuit device, according to an embodiment.
Figure 5:
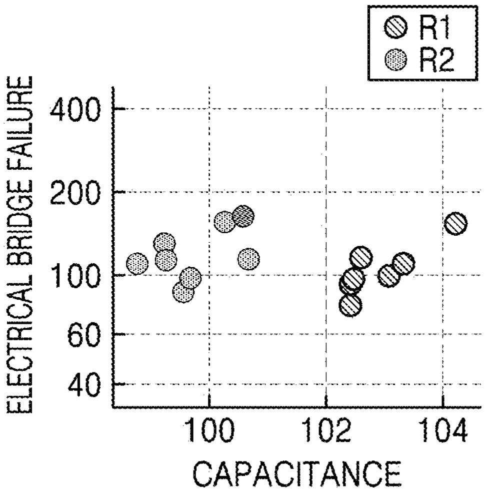
FIG. 5 is a graph showing the change in a characteristic of an electrical bridge in an integrated circuit device, according to an embodiment.

Characteristics of the integrated circuit device 10 according to an embodiment inventive concepts are described below. FIG. 4 is a graph showing a comparison of leakage current in an experimental example R1 of inventive concepts with leakage current in a comparative example R2. FIG. 5 is a graph showing a comparison of electrical bridge failure in the experimental example R1 of inventive concepts with electrical bridge failure in the comparative example R2.

FIG. 4 shows the change in leakage current characteristics according to existence or non-existence of the lower leakage current prevention layer 181 (in FIG. 2) in the experimental example R1 and the comparative example R2.

Referring to FIG. 4, through the comparison between the experimental example R1 and the comparative example R2, FIG. 4 shows the capacitance (the horizontal axis) of the dielectric film 180 (see FIG. 2) including the lower leakage current prevention layer 181 (see FIG. 2) is relatively high while leakage current (the vertical axis) therein is relatively low.

FIG. 5 shows the change in a characteristic of an electrical bridge according to existence or non-existence of the lower leakage current prevention layer 181 (see FIG. 2) in the experimental example R1 and the comparative example R2.

Referring to FIG. 5, through the comparison between the experimental example R1 and the comparative example R2, FIG. 5 shows the capacitance (the horizontal axis) of the dielectric film 180 (see FIG. 2) including the lower leakage current prevention layer 181 (see FIG. 2) is relatively high while electrical bridge failure (the vertical axis) therein tends to remain constant.

Figure 6:
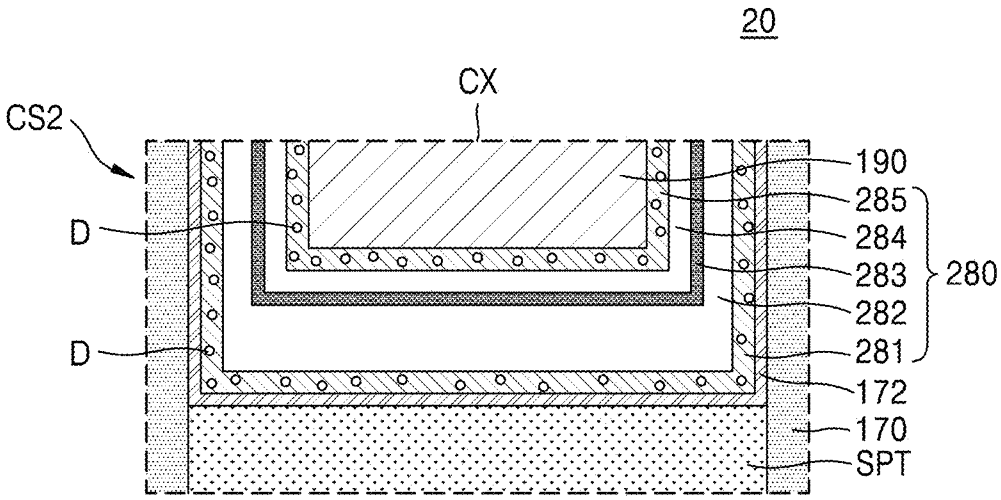
FIGS. 6 and 7 are cross-sectional views of integrated circuit devices according to embodiments.
Figure 7:
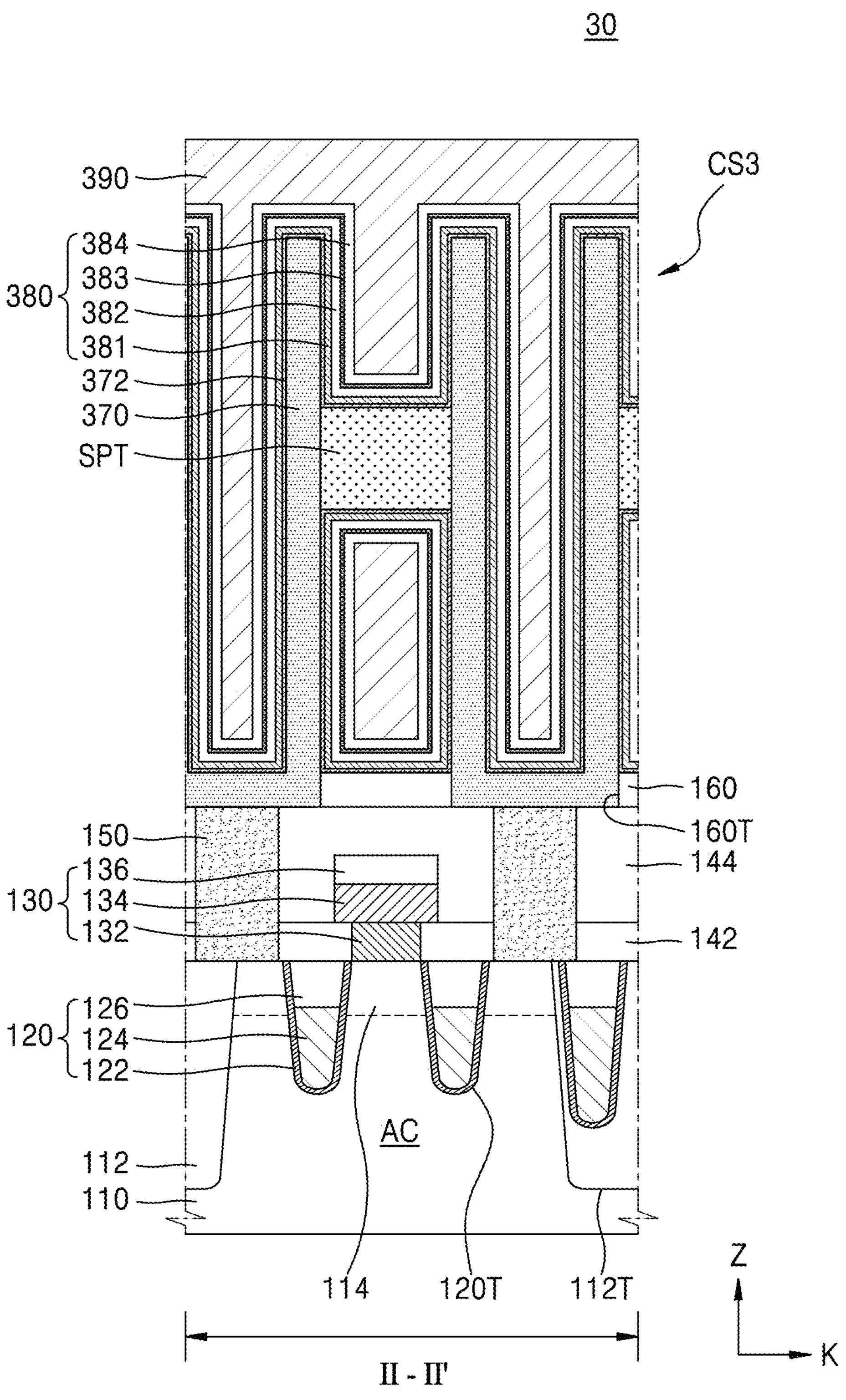

FIGS. 6 and 7 are cross-sectional views of integrated circuit devices 20 and 30 according to embodiments.

The elements of the integrated circuit devices 20 and 30 and the materials of the elements described below are mostly and substantially the same as or similar to those described above with reference to FIGS. 1 to 3. For convenience of description, therefore, the integrated circuit devices 20 and 30 are described focusing on the differences from the integrated circuit device 10.

Referring to FIG. 6, the integrated circuit device 20 may include a capacitor structure CS2, which includes the lower electrode 170, the supporter SPT supporting the lower electrode 170, a dielectric film 280 on the lower electrode 170, and the upper electrode 190 on the dielectric film 280.

The dielectric film 280 of the integrated circuit device 20 may have a stack structure sequentially including a lower leakage current prevention layer 281, a first capacitor material layer 282, an upper material layer 283, a second capacitor material layer 284, and an upper leakage current prevention layer 285.

The upper leakage current prevention layer 285 may include a dielectric material doped with the impurities D. For example, the impurities D may include at least one selected from Al, Si, Mg, Ca, Co, Y, Ta, Nb, Hf, Zr, and Mo. The thickness of the upper leakage current prevention layer 285 may be less than or equal to about 1 nm but is not limited thereto.

The upper leakage current prevention layer 285 may conformally surround the lower portion of the upper electrode 190. In other words, the upper leakage current prevention layer 285 may be formed in a different position than the lower leakage current prevention layer 281 but include substantially the same material as the lower leakage current prevention layer 281.

In an embodiment, the upper leakage current prevention layer 285 may be formed by alternately performing first and second ALD processes, which include different precursors from each other, such that the upper leakage current prevention layer 285 includes a very small amount of impurities D.

Referring to FIG. 7, the integrated circuit device 30 may include a capacitor structure CS3, which includes a lower electrode 370, the supporter SPT supporting the lower electrode 370, a dielectric film 380 on the lower electrode 370, and an upper electrode 390 on the dielectric film 380.

The lower electrode 370 of the integrated circuit device 30 may have a cylindrical or cup shape with a closed bottom on the contact structure 150.

When the lower electrode 370 has a cylindrical shape, the surface area of the lower electrode 370 corresponding to a storage electrode may be increased and/or maximized, and accordingly, the capacitance of the capacitor structure CS3 may increase.

In an embodiment, the dielectric film 380 may be arranged on the outer surface of a lower doped layer 372 so as to surround the lower electrode 370 and the supporter SPT. The dielectric film 380 may have a stack structure sequentially including a lower leakage current prevention layer 381, a first capacitor material layer 382, an upper material layer 383, and a second capacitor material layer 384.

FIGS. 8 to 11 are flowcharts of a method of manufacturing an integrated circuit device, according to an embodiment.

When it is possible to modify an embodiment, the order of operations may be different from the order in which the operations are described. For instance, two operations described as being performed sequentially may be substantially performed simultaneously or in a reverse order.

Figure 8:
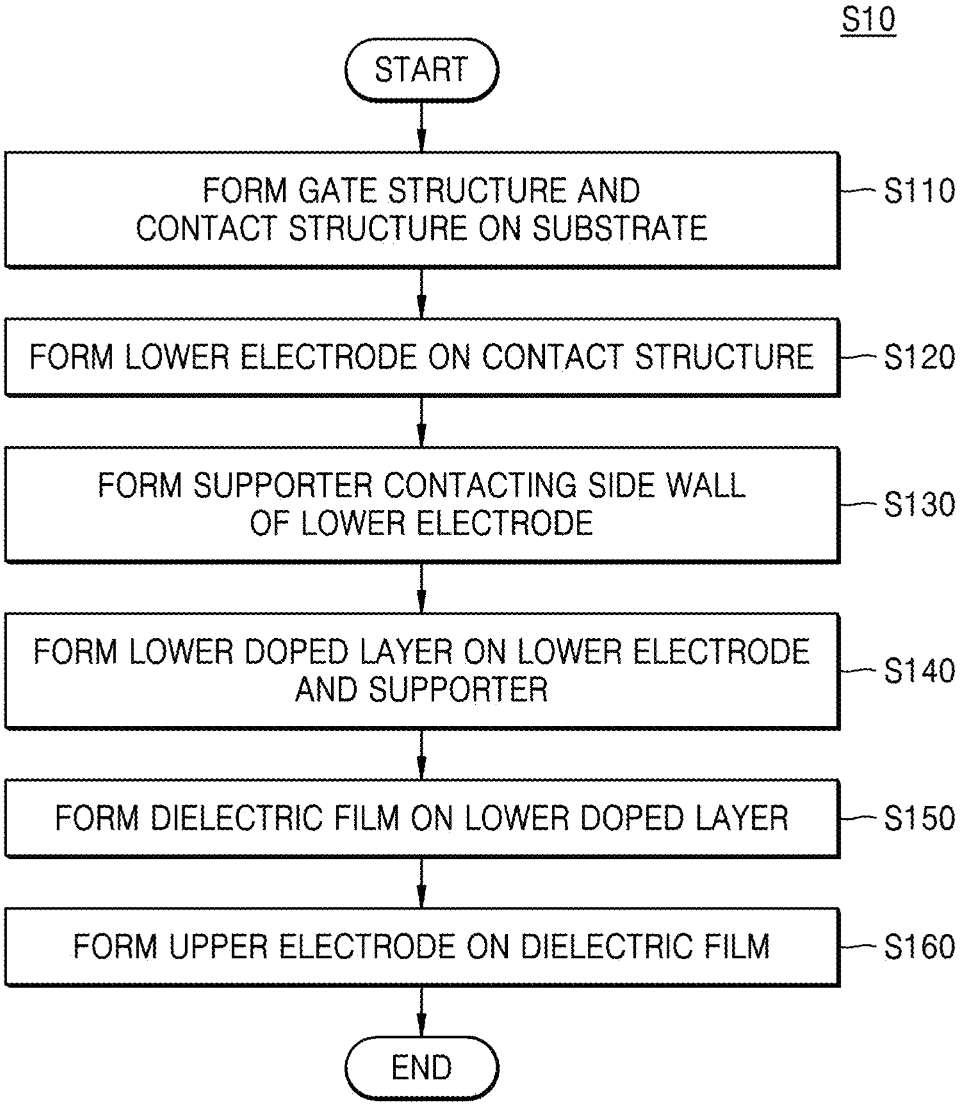
FIGS. 8 to 11 are flowcharts of a method of manufacturing an integrated circuit device, according to an embodiment.

Referring to FIG. 8, a method S10 of manufacturing an integrated circuit device may include the sequence of operations S110 to S160.

The method S10 may include forming a gate structure and a contact structure on a substrate in operation S110, forming a lower electrode on the contact structure in operation S120, forming a supporter contacting a side wall of the lower electrode in operation S130, forming a lower doped layer on the lower electrode and the supporter in operation S140, forming a dielectric film on the lower doped layer in operation S150, and forming an upper electrode on the dielectric film in operation S160.

The technical characteristics of operations S110 to S160 are described in detail below with reference to FIGS. 12 to 19.

Figure 9:
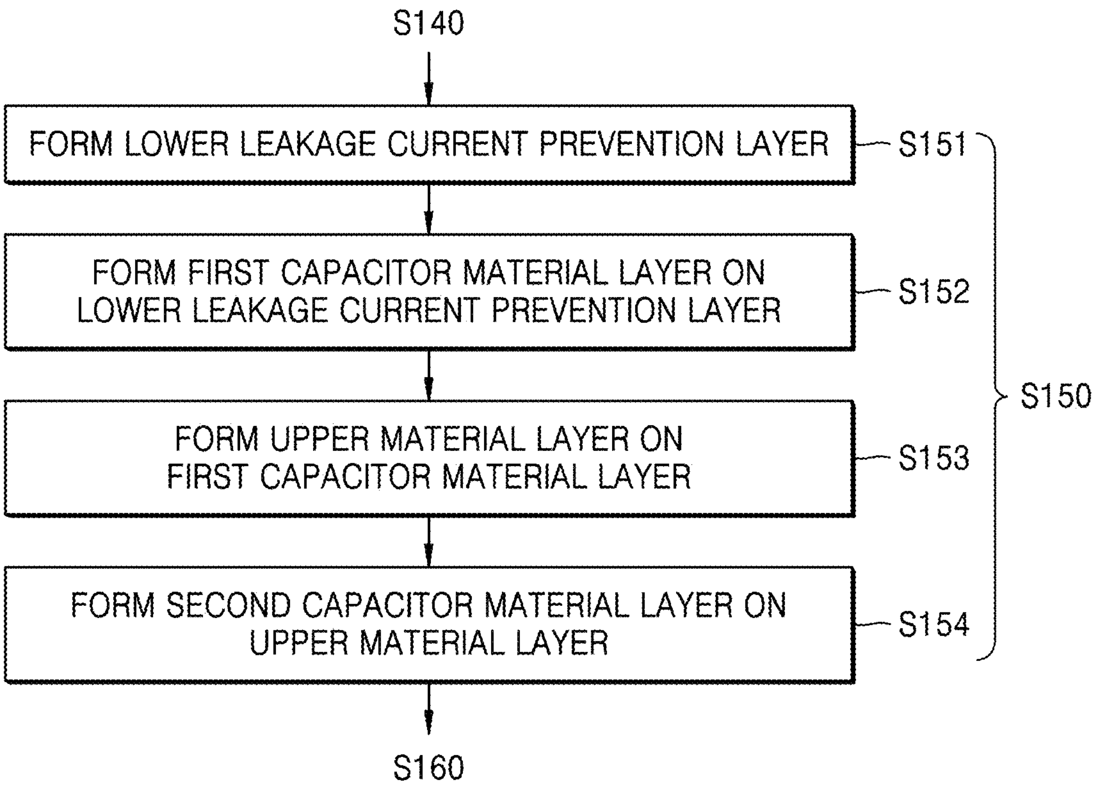

Referring to FIG. 9, operation S150 of forming the dielectric film in the method S10 may include sub operations S151 to S154.

In the method S10, operation S150 may include forming a lower leakage current prevention layer in sub operation S151, forming a first capacitor material layer on the lower leakage current prevention layer in sub operation S152, forming an upper material layer on the first capacitor material layer in sub operation S153, and forming a second capacitor material layer on the upper material layer in sub operation S154.

The lower leakage current prevention layer, the first capacitor material layer, the upper material layer, and the second capacitor material layer of the dielectric film are substantially the same as those described above, and thus, detailed descriptions thereof are omitted.

Figure 10:
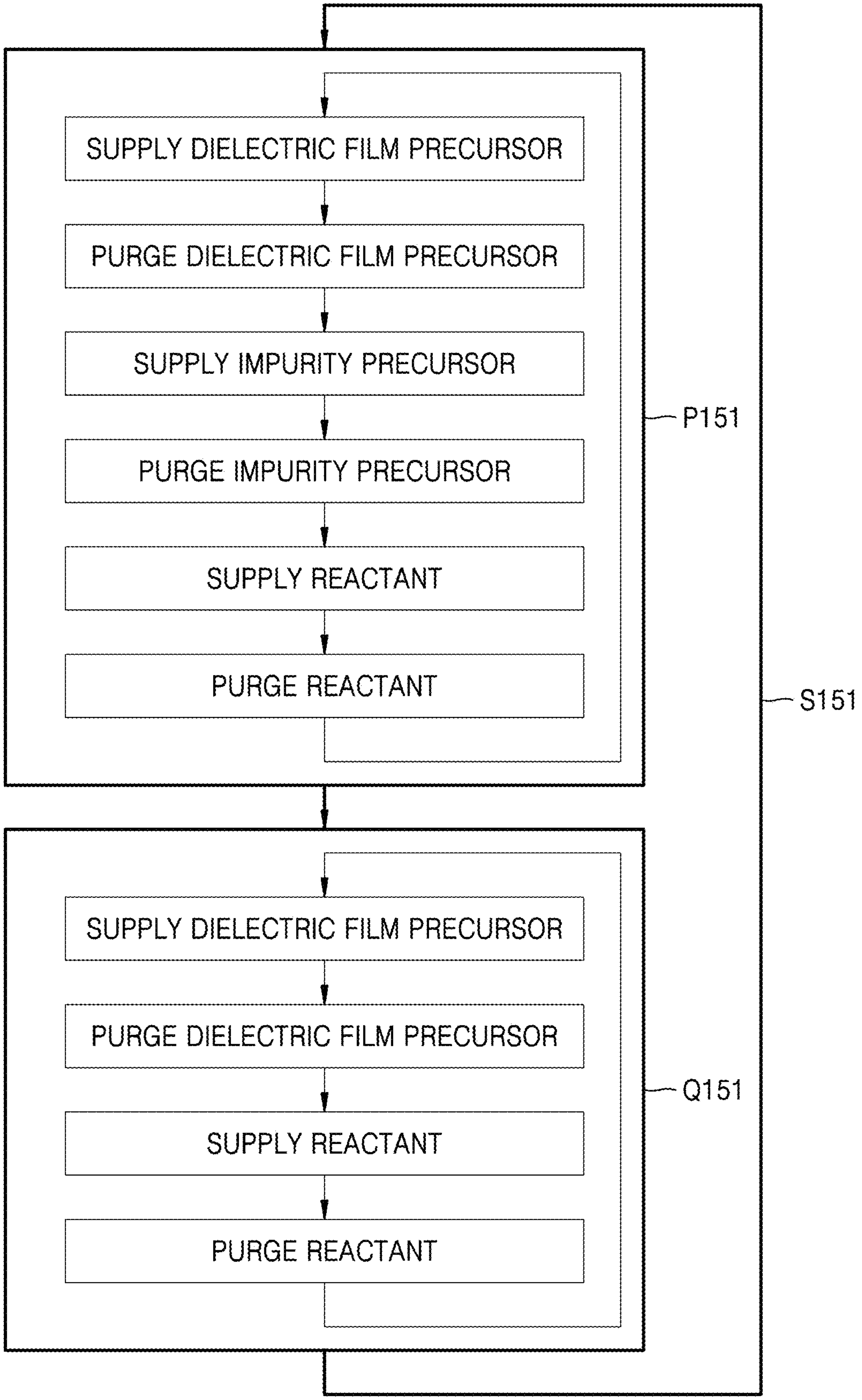

Referring to FIG. 10, in the method S10 of manufacturing an integrated circuit device, sub operation S151 of forming the lower leakage current prevention layer may include first and second ALD processes P151 and Q151.

The first ALD process P151 may include a cycle of supplying and purging a dielectric film precursor, supplying and purging an impurity precursor, and supplying and purging a reactant.

In detail, the dielectric film precursor may be supplied to a lower layer to be adsorbed to the surface of the lower layer. As a result, self-organized and oriented adsorption of the dielectric film precursor may be performed on the surface of the lower layer. Because of the chemosystematic characteristics of the dielectric film precursor, the dielectric film precursor may not completely cover the surface of the lower layer. Therefore, a gap may be formed on the surface of the lower layer. The gap may remain even after a non-adsorbed portion of the dielectric film precursor is removed by purge and act as an adsorption site of an impurity precursor.

Thereafter, an impurity precursor may be supplied to the lower layer to be adsorbed to a surface of the lower layer, which is exposed by the gap. As a result, the impurity precursor adsorbed to the gap may remain even after a non-adsorbed portion of the impurity precursor is removed by purge and stably adsorbed to the surface of the lower layer.

Thereafter, a reactant may be supplied to the adsorbed dielectric film precursor and impurity precursor. As such, the dielectric film precursor and the impurity precursor may decompose into a first atomic layer. An unreacted portion of the reactant and a by-product may be purged such that a first cycle is completed.

Consequently, the first atomic layer constituted of mainly a dielectric material and a very small amount of impurities may be formed. Here, the impurities may include the impurities D (see FIG. 2) described above. To control the concentration of impurities, the first cycle may be repeatedly performed A times (where A is a natural number).

The second ALD process Q151 may include a cycle of supplying and purging a dielectric film precursor and supplying and purging a reactant.

In detail, the dielectric film precursor may be supplied to the first atomic layer to be adsorbed to the surface of the first atomic layer. A non-adsorbed portion of the dielectric film precursor is removed by purge. As a result, self-organized and oriented adsorption of the dielectric film precursor may be performed on the surface of the first atomic layer.

Thereafter, a reactant may be supplied to the adsorbed dielectric film precursor. As such, the dielectric film precursor may decompose into a second atomic layer. An unreacted portion of the reactant and a by-product may be purged such that a second cycle is completed.

Consequently, the second atomic layer constituted of a dielectric material may be formed on the first atomic layer. To obtain a desired thickness of the dielectric material, the second cycle may be repeatedly performed B times (where B is a natural number). A and B may be the same as each other or different from each other.

In the method S10 according to inventive concepts, the first and second ALD processes P151 and Q151 may be repeatedly performed C times (where C is a natural number) to form the lower leakage current prevention layer to a desired thickness.

Figure 11:
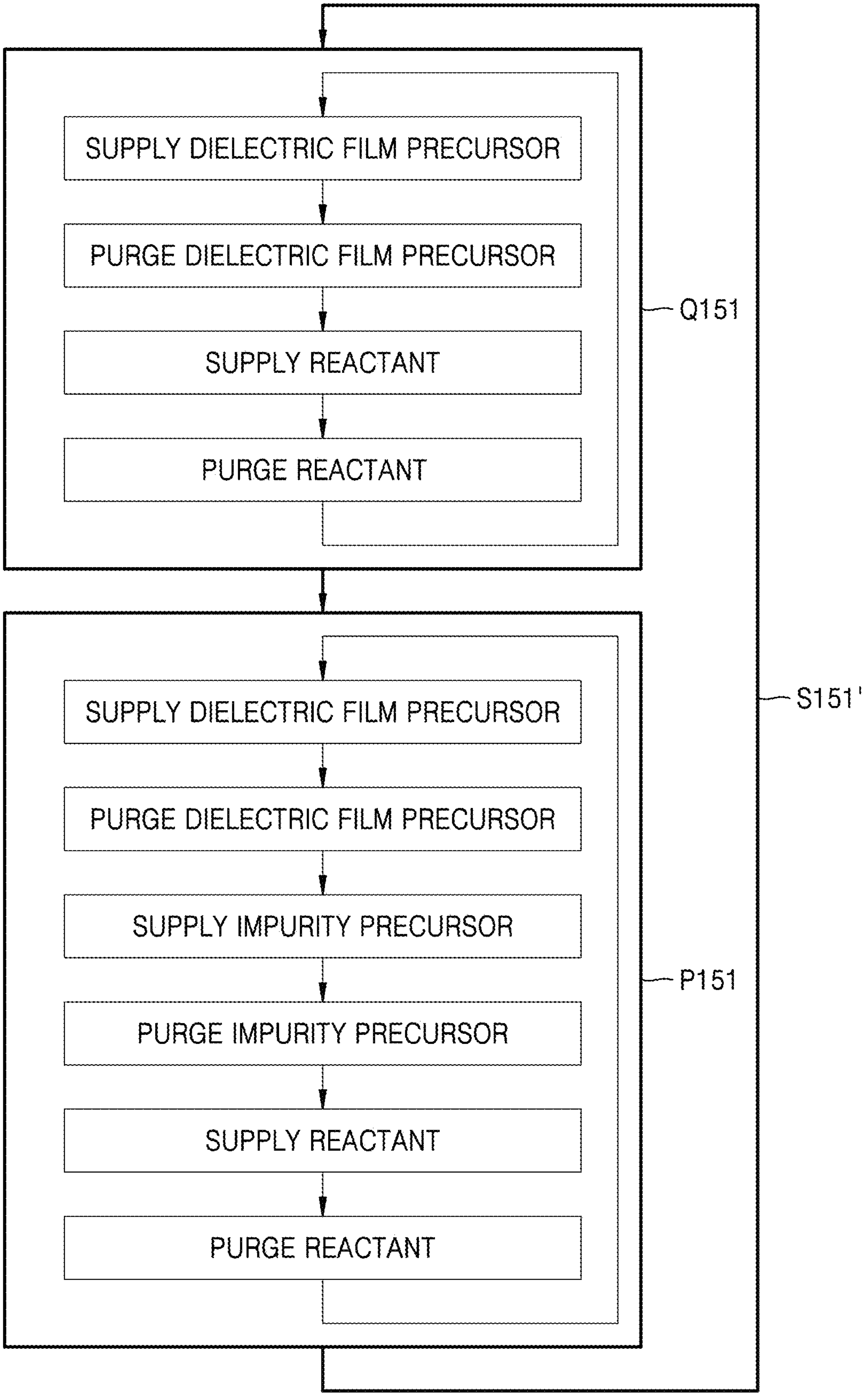

Referring to FIG. 11, in the method S10 of manufacturing an integrated circuit device, sub operation S151' of forming the lower leakage current prevention layer may include first and second ALD processes Q151 and P151.

The first ALD process Q151 may include a cycle of supplying and purging a dielectric film precursor and supplying and purging a reactant.

The second ALD process P151 may include a cycle of supplying and purging a dielectric film precursor, supplying and purging an impurity precursor, and supplying and purging a reactant.

In other words, the first and second ALD processes P151 and Q151 in sub operation S151 described above may be performed in reverse order in sub operation S151'. Apart from this, sub operation S151' is substantially the same as sub operation S151, and thus, detailed descriptions thereof are omitted.

FIGS. 12 to 19 are cross-sectional views of stages in a method of manufacturing an integrated circuit device, according to an embodiment.

For convenience of descriptions, FIGS. 12 to 19 are cross-sectional views taken along the line II-II' in FIG. 1.

Figure 12:
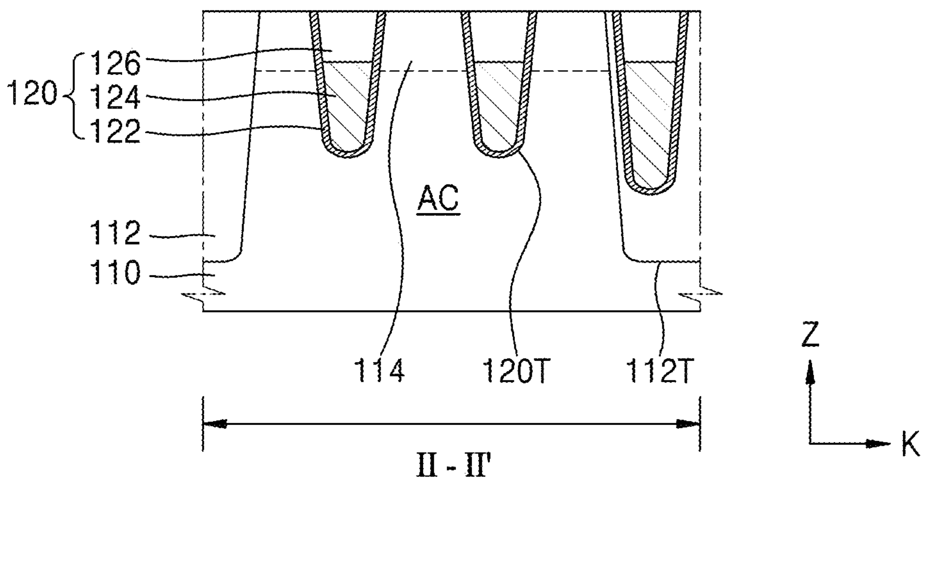
FIGS. 12 to 19 are cross-sectional views of stages in a method of manufacturing an integrated circuit device, according to an embodiment.

Referring to FIG. 12, the isolation trench 112T may be formed in the substrate 110, and the isolation film 112 defining the active region AC may be formed in the isolation trench 112T.

Subsequently, a mask pattern (not shown) may be formed on the substrate 110, and a plurality of gate line trenches 120T may be formed in the substrate 110 by using the mask pattern as an etch mask. The gate line trenches 120T may extend in parallel with each other, and each of the gate line trenches 120T may have a line shape crossing the active region AC.

Subsequently, the gate insulating layer 122 may be formed on the inner wall of each of the gate line trenches 120T. The gate electrode layer 124 may be formed by forming a gate conductive layer (not shown) on the gate insulating layer 122 to fill each gate line trench 120T and then removing an upper portion of the gate conductive layer to a certain height using an etch back process.

Subsequently, the gate capping layer 126 may be formed in the gate line trench 120T by forming an insulating material to fill the remaining portion of the gate line trench 120T and planarizing the insulating material to expose the top surface of the substrate 110. At this time, the mask pattern may be removed.

Subsequently, the source/drain region 114 may be formed by implanting impurity ions into a portion of the substrate 110 at each of opposite sides of the gate structure 120. Alternatively, the source/drain region 114 may be formed on the active region AC by implanting impurity ions into the substrate 110 after the isolation film 112 is formed.

Figure 13:
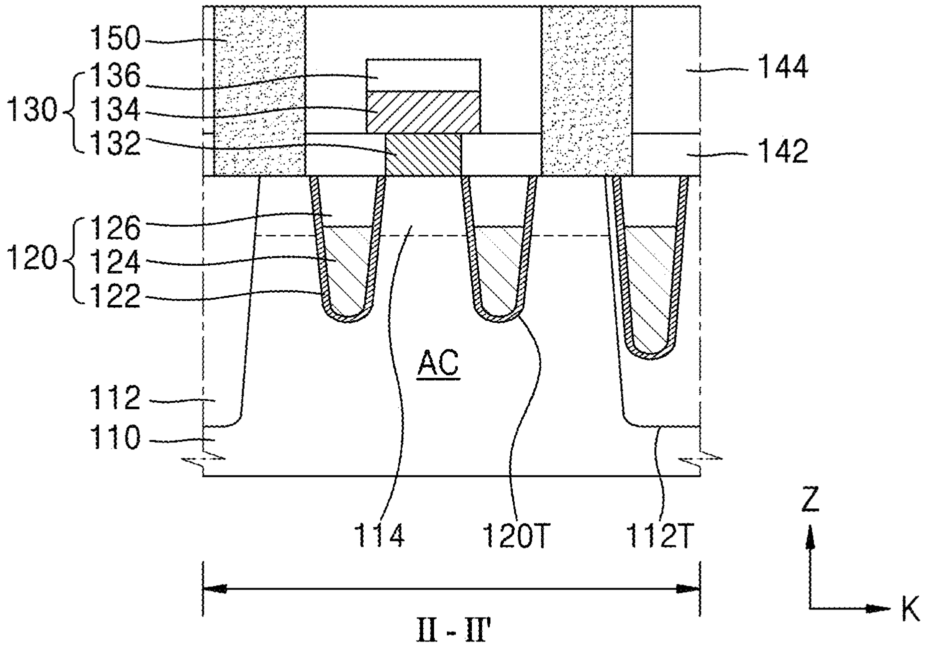

Referring to FIG. 13, the first interlayer insulating film 142 may be formed on the substrate 110, and an opening may be formed in the first interlayer insulating film 142 to expose a top surface of the source/drain region 114.

The bit line contact 132 electrically connected to the source/drain region 114 may be formed in the opening by forming a conductive layer on the first interlayer insulating film 142 to fill the opening and planarizing an upper portion of the conductive layer.

Subsequently, the bit line 134 and the bit line capping layer 136 may be formed to extend in the Y-direction, which is parallel with the top surface of the substrate 110, by sequentially forming a conductive layer and an insulating layer on the first interlayer insulating film 142 and then patterning the conductive layer and the insulating layer. Although not shown, a bit line spacer may be further formed on the side walls of the bit line 134 and the bit line capping layer 136.

Subsequently, the second interlayer insulating film 144 may be formed on the first interlayer insulating film 142 to cover the bit line 134 and the bit line capping layer 136.

Subsequently, an opening may be formed in the first and second interlayer insulating films 142 and 144 to expose the top surface of the source/drain region 114, and a contact structure 150 may be formed in the opening. In some embodiments, the contact structure 150 may be formed by sequentially forming a lower contact (not shown), a metal silicide layer (not shown), and an upper contact (not shown) in the opening.

Figure 14:
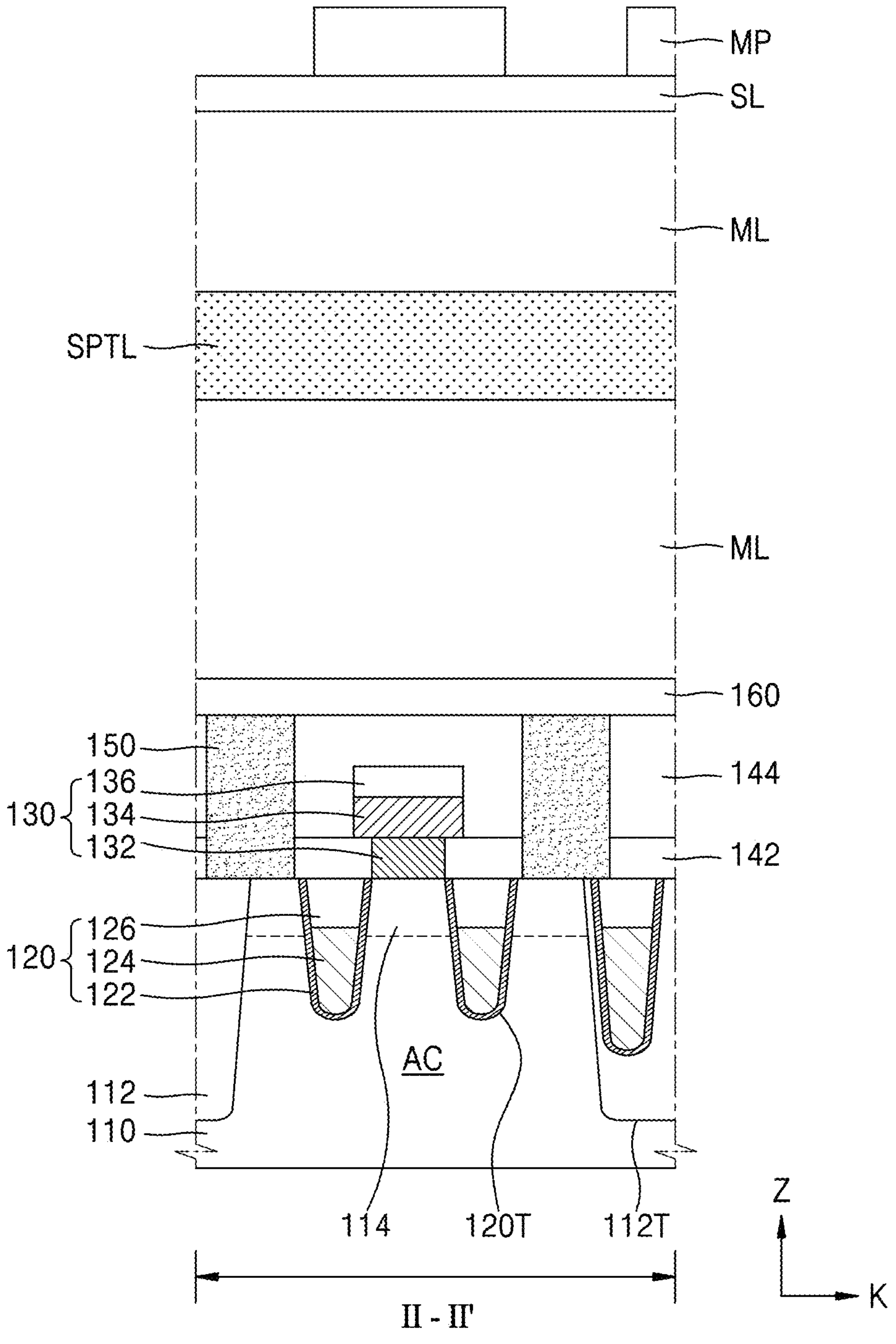

Referring to FIG. 14, the etch stop film 160, a mold layer ML, a supporter forming layer SPTL, and a sacrificial layer SL may be sequentially formed on the second interlayer insulating film 144 and the contact structure 150.

The mold layer ML may include silicon oxide. For example, the mold layer ML may be formed using a material, such as BPSG, spin on dielectric (SOD), PSG, PE-TEOS, or low pressure TEOS (LPTEOS). The mold layer ML may be formed to a thickness of about 500 nm to about 4000 nm but is not limited thereto.

Subsequently, the supporter forming layer SPTL may be formed in the mold layer ML. The supporter forming layer SPTL may include an insulating material, such as silicon oxide, silicon nitride, or silicon oxynitride.

Subsequently, the sacrificial layer SL may be formed on the mold layer ML. For example, the sacrificial layer SL may be formed using a material, such as TEOS, BPSG, PSG, USG, SOD, or high density plasma oxide (HDP). The sacrificial layer SL may be formed to a thickness of about 50 nm to about 200 nm but is not limited thereto.

Subsequently, a mask pattern MP may be formed by applying photoresist to the sacrificial layer SL and patterning the photoresist through exposure and development. A region, in which the lower electrode 170 (see FIG. 17) is formed, may be defined by the mask pattern MP. An anti-reflective coating (ARC) (not shown) may also be formed on the sacrificial layer SL.

Figure 15:
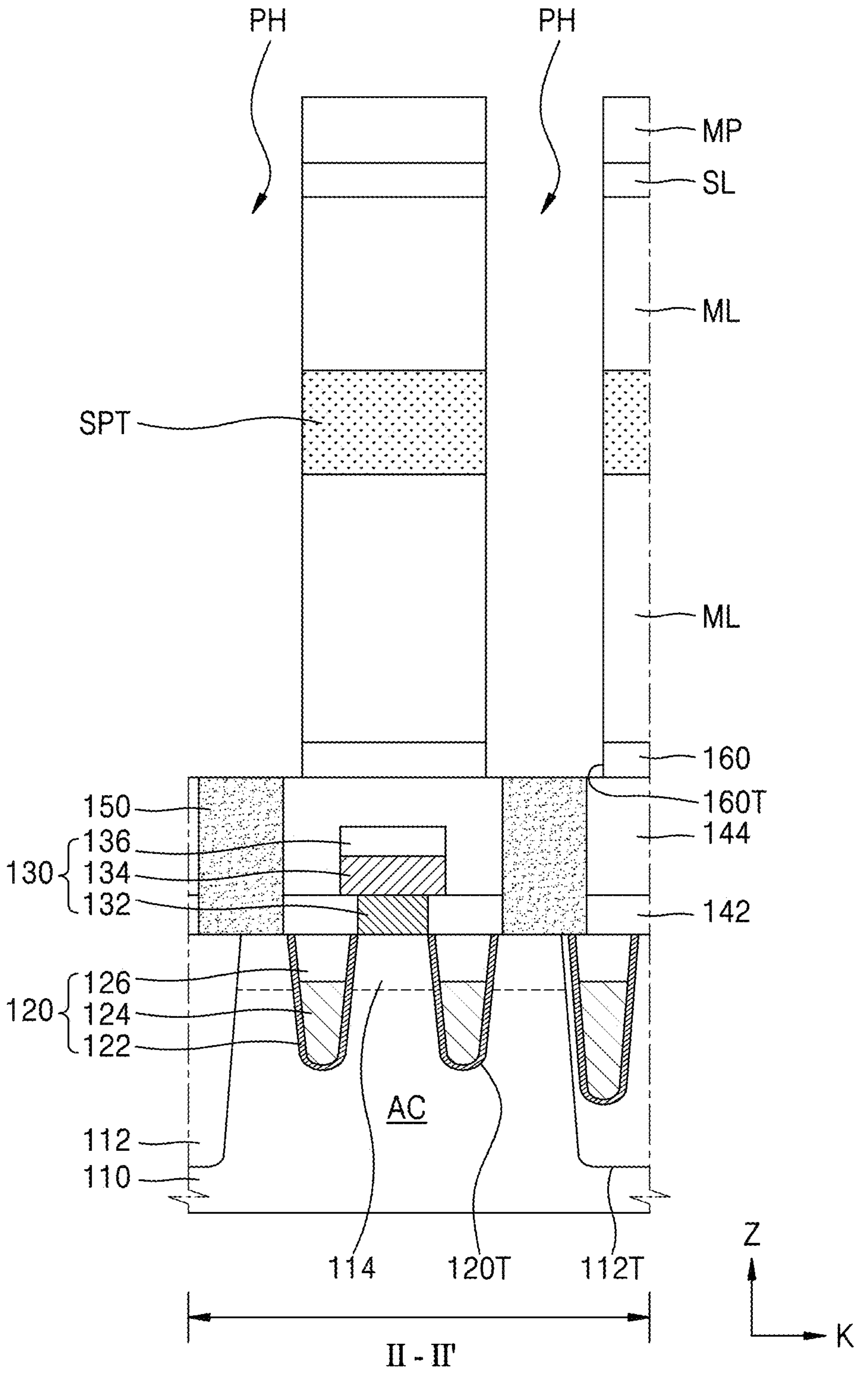

Referring to FIG. 15, a through hole PH may be formed by sequentially etching the sacrificial layer SL, the supporter forming layer SPTL, and the mold layer ML by using the mask pattern MP as an etch mask.

Subsequently, the opening 160T may be formed by removing a portion of the etch stop film 160, which is exposed at the bottom of the through hole PH. The top surface of the contact structure 150 may be exposed by the through hole PH and the opening 160T.

Subsequently, the mask pattern MP may be removed by ashing and stripping processes.

Figure 16:
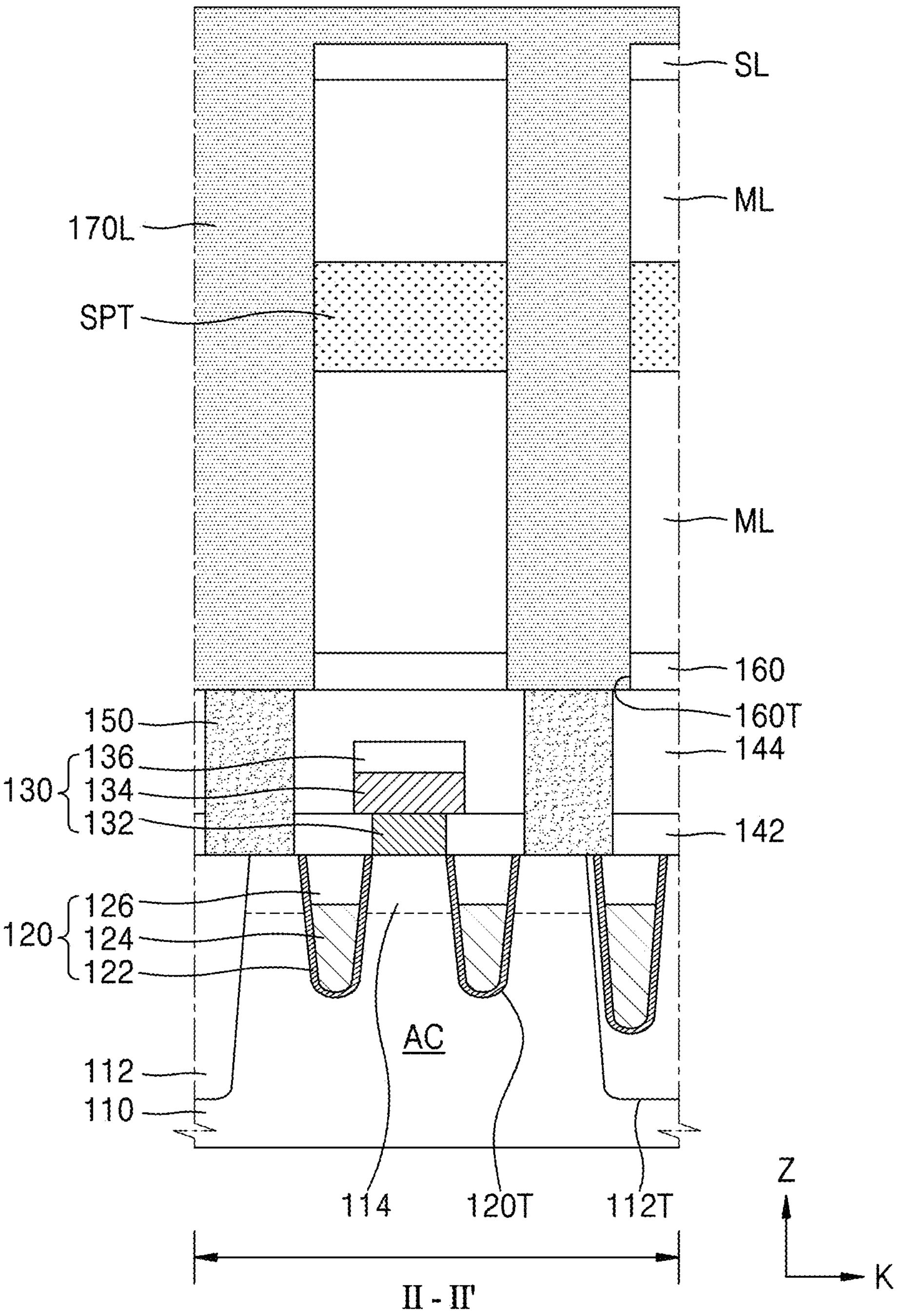

Referring to FIG. 16, a lower electrode forming layer 170L may be formed to conformally cover the inner walls of the through hole PH and the opening 160T.

In some embodiments, the lower electrode forming layer 170L may be formed on the side surfaces of the etch stop film 160, the side surfaces of the mold layer ML, the side surfaces of the supporter forming layer SPTL, and the side and top surfaces of the sacrificial layer SL so as to be in contact with the top surface of the contact structure 150. For example, the lower electrode forming layer 170L may be formed using CVD or ALD.

Figure 17:
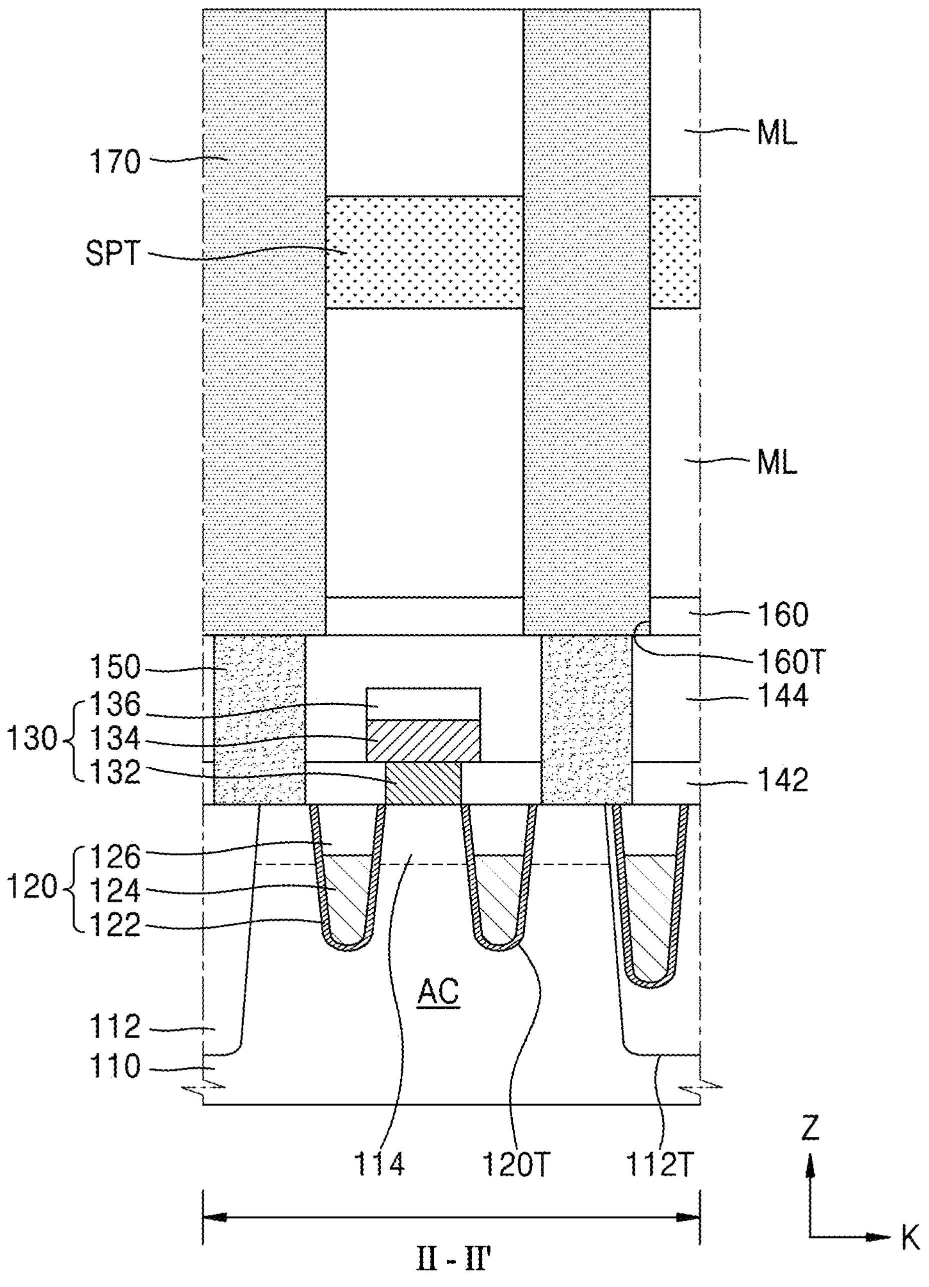

Referring to FIG. 17, the lower electrode 170 may be formed by removing a portion of the lower electrode forming layer 170L (see FIG. 16), which is above the top surface of the mold layer ML, and the sacrificial layer SL (see FIG. 16) using a node separation process.

The node separation process may remove the sacrificial layer SL through etch back or chemical mechanical polishing (CMP).

Subsequently, the mold layer ML may be removed. For example, when the mold layer ML includes silicon oxide, the mold layer ML may be completely removed by a wet etching process using hydrofluoric acid or buffered oxide etchant (BOE).

During the wet etching process, the supporter SPT may not be etched but remain and firmly support the lower electrode 170, thereby limiting and/or preventing the lower electrode 170 from collapsing or breaking. The lower electrode 170 may be formed on the contact structure 150 to have a pillar shape extending in a Z-direction that is perpendicular to the top surface of the substrate 110.

Figure 18:
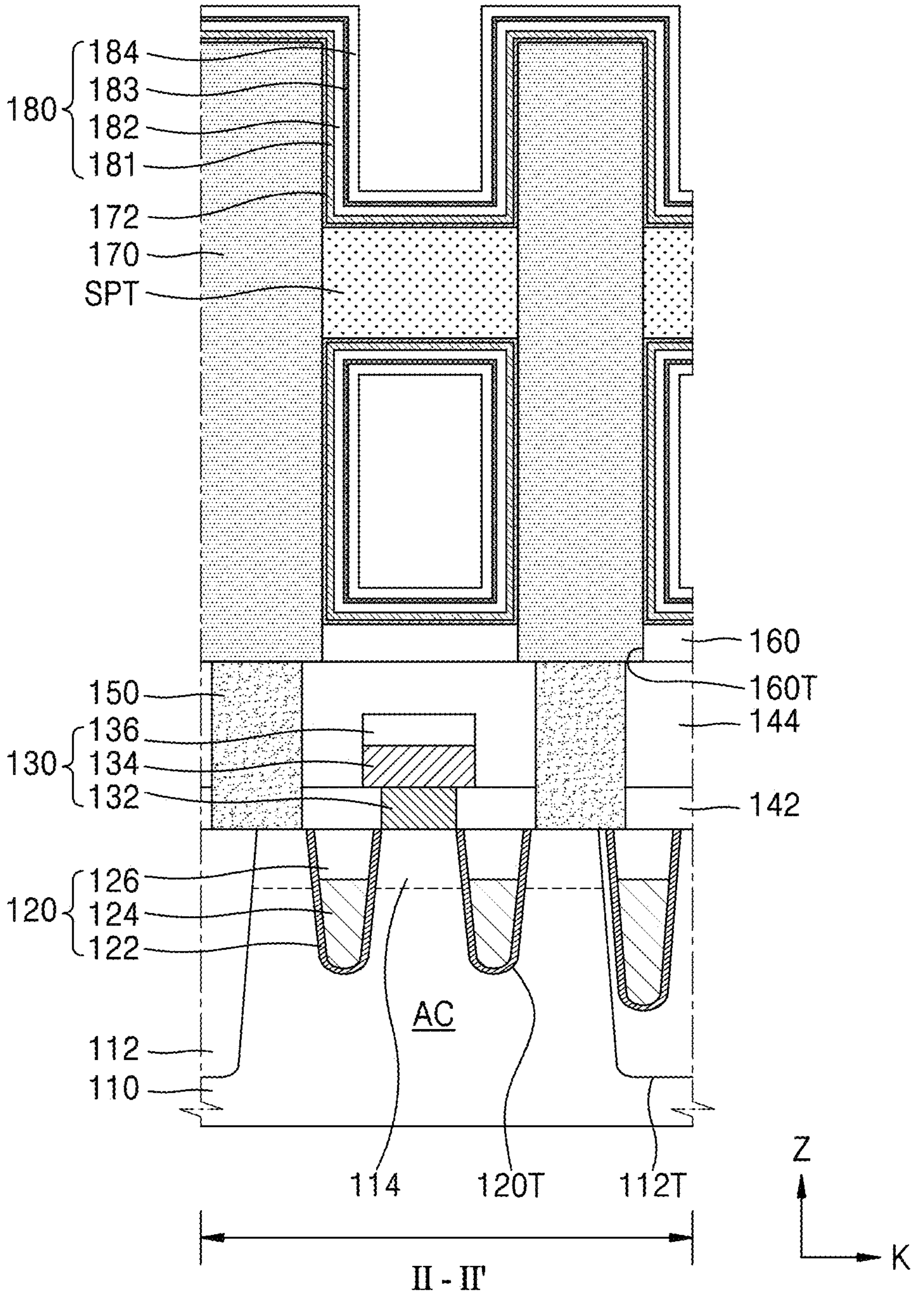

Referring to FIG. 18, the lower doped layer 172 may be conformally formed on the outer surfaces of the lower electrode 170 and the supporter SPT.

For example, the lower doped layer 172 may include $TiO_2$ doped with a group V element as an impurity. The lower doped layer 172 may be formed by ALD.

The dielectric film 180 may be formed on the outer surface of the lower doped layer 172 to surround the lower electrode 170 and the supporter SPT. The dielectric film 180 may be formed to have a stack structure sequentially including the lower leakage current prevention layer 181, the first capacitor material layer 182, the upper material layer 183, and the second capacitor material layer 184.

The lower leakage current prevention layer 181 may be formed using a dielectric material doped with impurities. For example, the impurities may include at least one selected from Al, Si, Mg, Ca, Co, Y, Ta, Nb, Hf, Zr, and Mo.

In an embodiment, the lower leakage current prevention layer 181 may be formed by alternately performing first and second ALD processes, which include different precursors from each other, such that the lower leakage current prevention layer 181 includes a very small amount of impurities.

Figure 19:
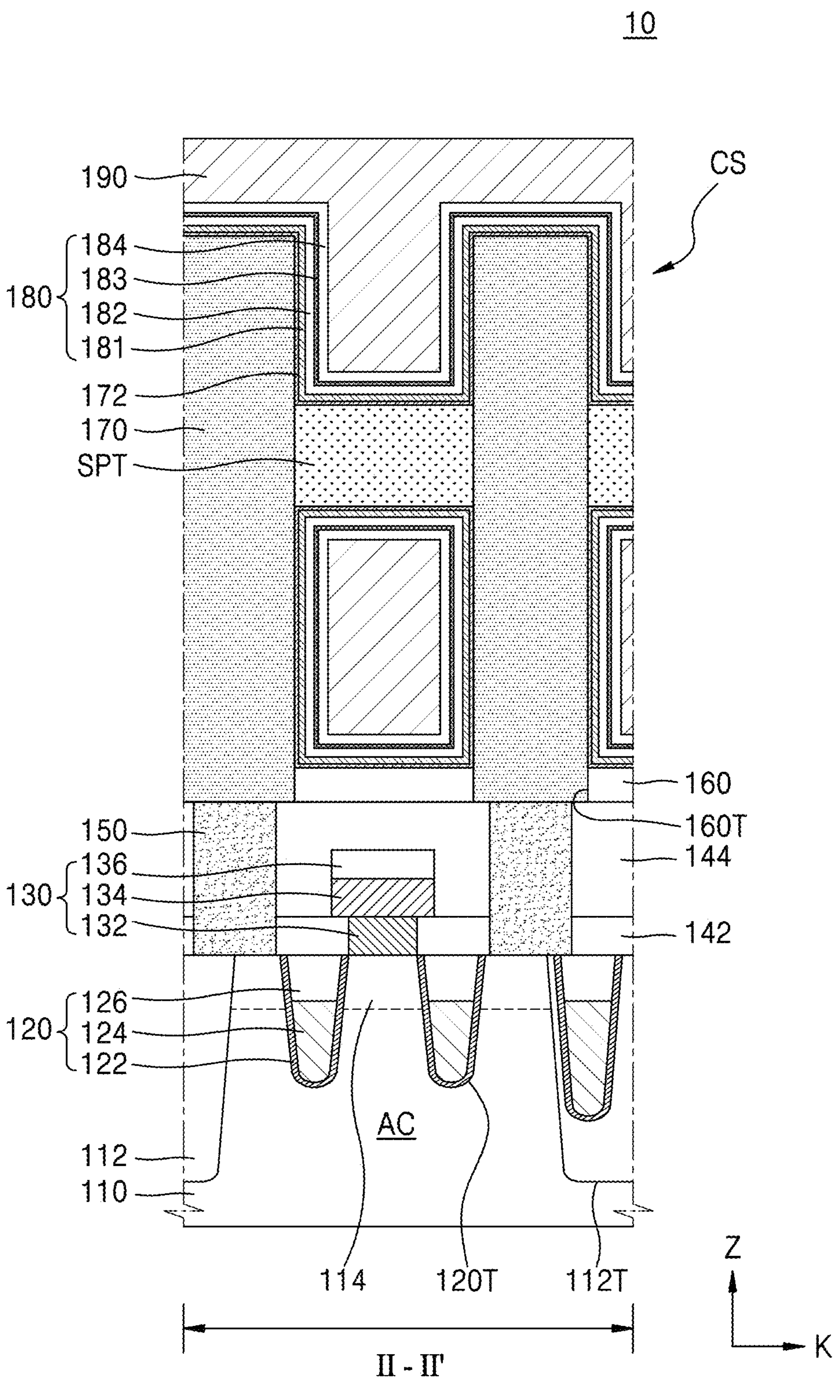

Referring to FIG. 19, the upper electrode 190 may be formed on the dielectric film 180.

The upper electrode 190 may be formed on the dielectric film 180 so as to completely fill the space defined by neighboring lower electrodes 170. The upper electrode 190 may be conformally formed on the dielectric film 180 to cover each lower electrode 170 with the dielectric film 180 between the upper electrode 190 and the lower electrode 170.

In some embodiments, the upper electrode 190 may be formed to be in direct contact with the second capacitor material layer 184. The upper electrode 190 may include metal nitride, metal, or a combination thereof. For example, the upper electrode 190 may include at least one selected from TiN, TaN, WN, Ru, Pt, and Ir.

The integrated circuit device 10 may be completely formed by sequentially performing the processes described above.

Eventually, leakage current flowing through the dielectric film 180 between neighboring lower electrodes 170 may be reduced in the integrated circuit device 10 by forming the lower leakage current prevention layer 181 using ALD, in which a very small amount of impurities may be supplied as a precursor.

Figure 20:
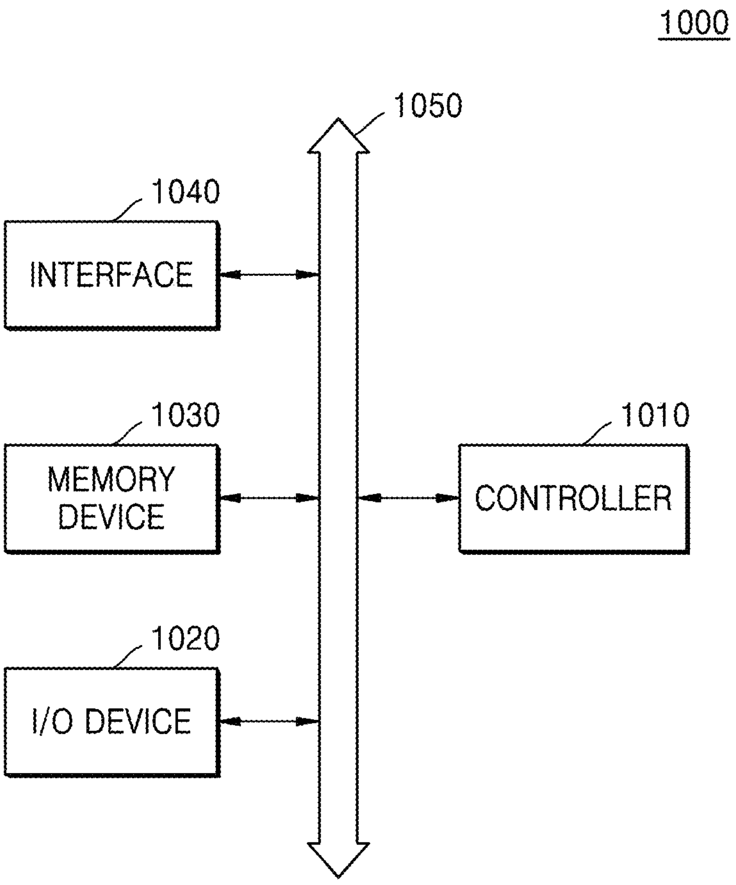
FIG. 20 is a block diagram of a system including an integrated circuit device, according to an embodiment.

FIG. 20 is a block diagram of a system 1000 including an integrated circuit device, according to an embodiment.

Referring to FIG. 20, the system 1000 may include a controller 1010, an input/output (I/O) device 1020, a memory device 1030, an interface 1040, and a bus 1050.

The system 1000 may include a mobile system or a system transmitting or receiving information. In some embodiments, the mobile system may include a portable computer, a web tablet, a mobile phone, a digital music player, or a memory card.

The controller 1010 may control an executable program in the system 1000 and include a microprocessor, a digital signal processor, a microcontroller, or the like.

The I/O device 1020 may be used for data input or output of the system 1000. The system 1000 may connect to and exchange data with an external device, e.g., a personal computer (PC) or a network, using the I/O device 1020. For example, the I/O device 1020 may include a touch screen, a touch pad, a keyboard, or a display.

The memory device 1030 may store data for the operation of the controller 1010 or data that has been processed by the controller 1010. The memory device 1030 may include the integrated circuit device 10, 20, or 30 described above according to inventive concepts.

The interface 1040 may correspond to a data transmission passage between the system 1000 and an external device. The controller 1010, the I/O device 1020, the memory device 1030, and the interface 1040 may communicate with one another through the bus 1050.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been particularly shown and described with reference to embodiments thereof, it will be understood that various changes in form and details may be made therein without departing from the spirit and scope of the following claims.

What is claimed is:

1. A method of manufacturing an integrated circuit device, the method comprising:

forming a plurality of lower electrodes above a substrate;

forming a supporter configured to support the plurality of lower electrodes;

forming a dielectric film on the plurality of lower electrodes and the supporter; and forming an upper electrode on the dielectric film, wherein the dielectric film includes a lower leakage current prevention layer on an outer surface of each of the plurality of lower electrodes and an outer surface of the supporter, a first capacitor material layer on the lower leakage current prevention layer, an upper material layer on the first capacitor material layer, and a second capacitor material layer on the upper material layer, wherein the lower leakage current prevention layer includes a dielectric material doped with impurities, and the impurities include at least one of aluminum (Al), silicon (Si), magnesium (Mg), calcium (Ca), cobalt (Co), yttrium (Y), tantalum (Ta), niobium (Nb), hafnium (Hf), zirconium (Zr), and molybdenum (Mo), the forming the lower leakage current prevention layer includes alternately performing a first atomic layer deposition process and a second atomic layer deposition process, the first atomic layer deposition process includes a cycle of supplying and purging a dielectric film precursor, supplying and purging an impurity precursor, and supplying and purging a reactant, and the second atomic layer deposition process includes a cycle of supplying and purging the dielectric film precursor and supplying and purging the reactant.

2. The method of claim 1, wherein the first atomic layer deposition process is repeatedly performed A times in a first process, the second atomic layer deposition process is repeatedly performed B times in a second process, and the lower leakage current prevention layer is formed by repeatedly performing the first process and the second process C times, and A, B, and C each are a natural number.

3. The method of claim 1, wherein the second atomic layer deposition process is repeatedly performed A times in a first process, the first atomic layer deposition process is repeatedly performed B times in a second process, and the lower leakage current prevention layer is formed by repeatedly performing the first process and the second process C times, A, B, and C each are a natural number.

4. The method of claim 1, wherein the first capacitor material layer and the second capacitor material layer include zirconium oxide ($ZrO_2$), and the upper material layer includes aluminum oxide ($Al_2O_3$).

5. The method of claim 1, further comprising:

forming a lower doped layer on the supporter and the plurality of lower electrodes, wherein the lower doped layer is formed between the lower leakage current prevention layer and the supporter, the lower doped layer is formed between the lower leakage current prevention layer and the plurality of lower electrodes, and the lower doped layer includes titanium oxide ($TiO_2$) doped with a group V element as an impurity.

6. The method of claim 5, wherein each of the lower doped layer and the lower leakage current prevention layer are formed by an atomic layer deposition process, and a thickness of the lower doped layer and a thickness of the lower leakage current prevention layer are each less than or equal to 1 nm.

7. The method of claim 1, wherein the first capacitor material layer is thicker than the second capacitor material layer.

8. The method of claim 1, wherein the lower leakage current prevention layer is configured to reduce leakage current flowing between the plurality of lower electrodes neighboring each other.

9. A method of manufacturing an integrated circuit device, the method comprising:

forming a plurality of lower electrodes above a substrate;

forming a supporter configured to support the plurality of lower electrodes;

forming a dielectric film on the plurality of lower electrodes and the supporter; and forming an upper electrode on the dielectric film, wherein the dielectric film includes a lower leakage current prevention layer on an outer surface of each of the plurality of lower electrodes and an outer surface of the supporter, a first capacitor material layer on the lower leakage current prevention layer, an upper material layer on the first capacitor material layer, a second capacitor material layer on the upper material layer, and an upper leakage current prevention layer on the second capacitor material layer wherein the lower leakage current prevention layer and the upper leakage current prevention layer each include a dielectric material doped with impurities, and the impurities include at least one of aluminum (Al), silicon (Si), magnesium (Mg), calcium (Ca), cobalt (Co), yttrium (Y), tantalum (Ta), niobium (Nb), hafnium (Hf), zirconium (Zr), and molybdenum (Mo).

10. The method of claim 9, further comprising:

forming a lower doped layer on the supporter and the plurality of lower electrodes, wherein the lower doped layer is formed between the lower leakage current prevention layer and the supporter, the lower doped layer is formed between the lower leakage current prevention layer and the plurality of lower electrodes, and the lower doped layer includes titanium oxide ($TiO_2$) doped with a group V element as an impurity.

11. The method of claim 10, wherein the plurality of lower electrodes are in direct contact with the lower doped layer, the lower doped layer is in direct contact with the lower leakage current prevention layer, and the upper electrode is in direct contact with the upper leakage current prevention layer.

12. The method of claim 9, wherein the lower leakage current prevention layer and the upper leakage current prevention layer are each formed by alternately performing a first atomic layer deposition process and a second atomic layer deposition process, the first atomic layer deposition process includes a cycle of supplying and purging a dielectric film precursor, supplying and purging an impurity precursor, and supplying and purging a reactant, and the second atomic layer deposition process includes a cycle of supplying and purging the dielectric film precursor and supplying and purging the reactant.

13. A method of manufacturing an integrated circuit device, the method comprising:

forming an isolation film on a substrate, the isolation film defining an active region of the substrate;

forming a gate structure on the substrate, the gate structure crossing the active region and extending in a first direction;

forming a source/drain in the active region, the source/drain respectively at opposite sides of the gate structure;

forming a bit line structure on the substrate, the bit line structure extending in a second direction, the second direction being perpendicular to the first direction;

forming a plurality of contact structures on the source/drain, respectively;

forming a plurality of lower electrodes on the plurality of contact structures, respectively;

forming a supporter configured to support the plurality of lower electrodes;

forming a dielectric film on the plurality of lower electrodes and the supporter;

forming a titanium oxide thin film on the supporter and the plurality of lower electrodes; and forming an upper electrode on the dielectric film, wherein the dielectric film includes a lower leakage current prevention layer on an outer surface of each of the plurality of lower electrodes and an outer surface of the supporter, a first capacitor material layer on the lower leakage current prevention layer, an upper material layer on the first capacitor material layer, and a second capacitor material layer on the upper material layer, the titanium oxide thin film is formed between the lower leakage current prevention layer and the supporter, the titanium oxide thin film is formed between the lower leakage current prevention layer and the plurality of lower electrodes, the titanium oxide thin film is doped with a group V element as an impurity, and the dielectric film further includes an upper leakage current prevention layer on the second capacitor material layer.

14. The method of claim 13, wherein the lower leakage current prevention layer, the upper leakage current prevention layer, or both the lower leakage current prevention layer and the upper leakage current prevention layer include a dielectric material doped with impurities, and the impurities include at least one of aluminum (Al), silicon (Si), magnesium (Mg), calcium (Ca), cobalt (Co), yttrium (Y), tantalum (Ta), niobium (Nb), hafnium (Hf), zirconium (Zr), and molybdenum (Mo).

15. The method of claim 14, wherein the dielectric material doped with the impurities is formed using an atomic layer deposition process, the atomic layer deposition process includes a first atomic layer deposition process and a second atomic layer deposition process alternating with each other, the first atomic layer deposition process includes a cycle of supplying and purging a dielectric film precursor, supplying and purging an impurity precursor, and supplying and purging a reactant, and the second atomic layer deposition process includes a cycle of supplying and purging the dielectric film precursor and supplying and purging the reactant.

16. The method of claim 14, wherein the upper leakage current prevention layer is configured to reduce leakage current between the plurality of lower electrodes and the upper electrode, and the lower leakage current prevention layer is configured to reduce leakage current flowing between the plurality of lower electrodes neighboring each other.

* * * * *